(12) United States Patent
Labram et al.

(10) Patent No.: US 6,724,217 B2
(45) Date of Patent: *Apr. 20, 2004

(54) CMOS OUTPUT AMPLIFIER INDEPENDENT OF TEMPERATURE, SUPPLY VOLTAGE AND MANUFACTURING QUALITY OF TRANSISTORS

(75) Inventors: Steven M. Labram, Crolles (FR); Guy Mabboux, Chapareillan (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 10/150,832

(22) Filed: May 17, 2002

(65) Prior Publication Data

US 2002/0130684 A1 Sep. 19, 2002

Related U.S. Application Data

(63) Continuation of application No. 09/509,007, filed as application No. PCT/EP99/05339 on Jul. 19, 1999, now Pat. No. 6,414,516.

(30) Foreign Application Priority Data

Jul. 21, 1998 (FR) .............................. 9809436

(51) Int. Cl.$^7$ ............................................ H03K 19/003
(52) U.S. Cl. .............................. 326/26; 326/27; 326/72; 326/33; 326/74
(58) Field of Search ............................... 326/29, 27, 30, 326/31, 32, 33, 34, 87

(56) References Cited

U.S. PATENT DOCUMENTS 4,972,101 A * 11/1990 Partovi et al. ............... 307/443
5,428,303 A * 6/1995 Pasqualini ................... 326/27

* cited by examiner

*Primary Examiner*—Anh Tran
(74) *Attorney, Agent, or Firm*—Aaron Waxler

(57) ABSTRACT

The invention relates to a circuit of which the operating rate varies according to temperature, supply voltage and intrinsic quality of the transistors of the circuit, associated to a compensating circuit which comprises a constant current source (26) that produces a substantially constant current which is independent of temperature, supply voltage and intrinsic quality of the transistors of the circuit, a variable current source (28) producing a current that increases in an inverse proportion to temperature, supply voltage and intrinsic quality of the transistors of the circuit, and means for decreasing the operating rate of the circuit when the difference of the currents produced by the first and second sources increases.

6 Claims, 6 Drawing Sheets

CMOS OUTPUT AMPLIFIER INDEPENDENT OF TEMPERATURE, SUPPLY VOLTAGE AND MANUFACTURING QUALITY OF TRANSISTORS

This is a continuation of application Ser. No. 09/509,007 Mar. 20, 2000, now U.S. Pat. No. 6,414,516, which is a 371 of PCT/EP99/05339, AT filed Jul. 19, 1999.

The present invention relates to output amplifiers of integrated circuits, and more particularly, an output amplifier in CMOS technology whose operating rate is likely to vary as a function of the environment parameters of its transistors (temperature, supply voltage and manufacturing quality).

An output amplifier is used for transmitting electric signals to the outside of a circuit. Generally, the signals are supplied to electric conductors (pins, tracks) which are deemed equivalent to inductive and capacitive loads. The function of the output amplifier is mainly to adapt the signal transmitted to the outside of the circuit to the electric line that receives the signal.

FIG. 1 shows in a diagram an output amplifier 10 which drives a generally capacitive load 12. The amplifier 10 includes a P-channel MOS switching transistor 14 connected between a supply voltage terminal Vdd and an output terminal 0, and controlled by the output of an inverter 16. An N-channel MOS switching transistor 18 is connected between ground and the output terminal 0 and is controlled by the output of an inverter 20. The inputs of the inverters 16 and 20 are together connected to an input terminal I.

The output amplifier is to produce a voltage signal having sufficient amplitude to be interpretable as a logic signal. With each transition the amplifier is to charge and discharge the capacitive load 12. The gradient of the transition depends on the current that the amplifier is able to produce and on the value of the capacitive load 12. If the current is insufficient and the operating frequency is too high, the gradient of the transition is too small for the required amplitude to be reached within a period of time.

The intrinsic conductivity of the transistors, thus the current that the transistors are able to produce, varies according to the circuit temperature, the value of the supply voltage and the manufacturing quality of the transistors, the latter depending on the manufacturing processes of the integrated circuit. When an output amplifier is designed, it is generally desired to guarantee that it operates at a predetermined frequency in a given temperature range and in a given supply voltage range, whatever the manufacturing quality of the transistors. This leads to designing the transistors so that they have the required conductivity in worst case conditions (high temperature, low supply voltage, poor-quality transistors). The real environment parameters of the transistors are never the worst parameters. As a result, the output amplifiers are capable of supplying higher currents than required, to such an extent that they can generate too much noise during the switching in some applications.

It is an object of the present invention to provide a device that enables to compensate the characteristic variations of an output amplifier caused by a variation of its environment parameters.

To achieve this object, the present invention provides a circuit whose operating rate varies as a function of temperature, supply voltage and intrinsic transistor quality of the circuit transistors, associated to a compensation circuit that includes a constant current source producing a current that is substantially constant and independent of the temperature, the supply voltage and the intrinsic quality of the transistors of the circuit, a variable current source producing a current that increases with the inverse of the temperature, the supply voltage and the intrinsic quality of the circuit transistors, and means for decreasing the operating rate of the circuit when the difference of the currents produced by the first and second sources increases.

According to an aspect of the present invention, said means are provided for decreasing the rate at which transistor control signals of the circuit vary when said current difference increases.

According to an aspect of the present invention, the circuit includes MOS a switching transistors connected in parallel, and said means are provided to concurrently turn on a decreasing number of the transistors when the current difference increases.

According to an aspect of the present invention, the circuit includes inverters connected in a ring that forms an oscillator, and said means are provided for increasing the number of inverters connected in the ring when said current difference increases.

According to an aspect of the present invention, the circuit includes a first MOS transistor of a first conductivity type connected between a first supply voltage and an output terminal, and an inverter having its output terminal connected to the gate of the transistor, the means for decreasing the rate including an adjustable current source connected between a second supply voltage and a supply terminal of the inverter, a second supply terminal of the inverter being connected to the first supply voltage.

According to an aspect of the present invention, the adjustable current source is a second MOS transistor of a second conductivity type, controlled by a voltage varying in the opposite direction to said current difference.

According to an aspect of the present invention, said current difference is a digital signal carried on several control lines, a decreasing number of which is activated for discrete increasing values of the difference, and the adjustable current source includes a group of MOS transistors of the second conductivity type connected in parallel, each of which is controlled by one of the control lines.

According to an aspect of the present invention, the variable current source includes a current mirror reproducing a current that flows through a second MOS transistor of the first conductivity type connected to the first supply voltage and whose gate is connected to the second supply voltage, and each control line is connected to an output of a current mirror reproducing a constant current and to an output of a current mirror connected to reproduce the current of the variable current source according to a predetermined ratio, different for each control line.

According to an aspect of the present invention, the gate of each switching transistor is connected to an output of a current mirror reproducing a constant current and to an output of the current mirror connected to reproduce the current of the variable current source according to a predetermined ratio, different for each control line.

According to an aspect of the present invention, said means generate a digital control signal carried on several control lines, a single line being activated at a time, the rank of the activated line increasing with said difference, the control lines being connected so that each line activates a loop including a number of inverters increasing with the rank of the line.

These objects, characteristic features and advantages and even more of the present invention will be discussed in detail in the following non-limiting description of specific embodiments in connection with the appended drawings.

FIG. 1, previously described, shows a conventional output amplifier;

The present invention provides a compensation of the increase of the intrinsic conductivity of the transistors with the aid of a current that increases with this intrinsic conductivity.

Figure 1:
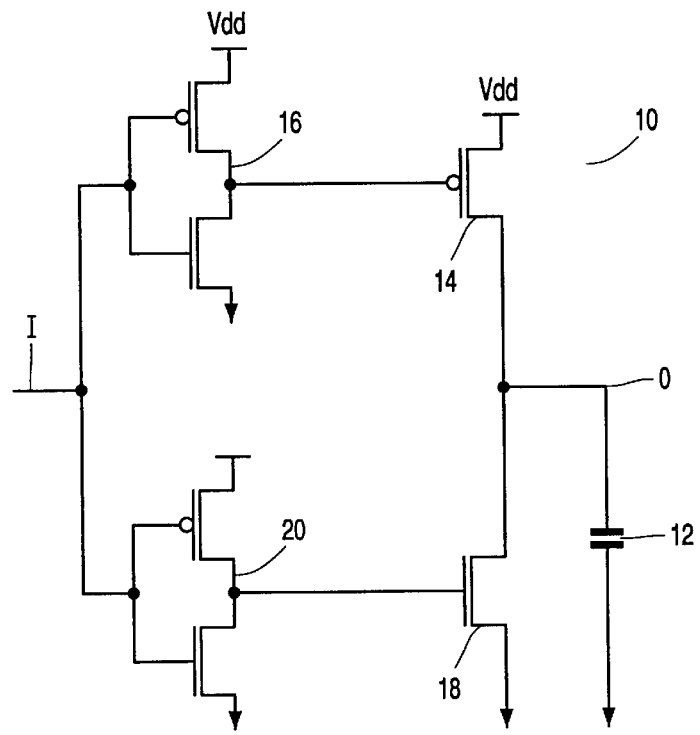
Figure 2:
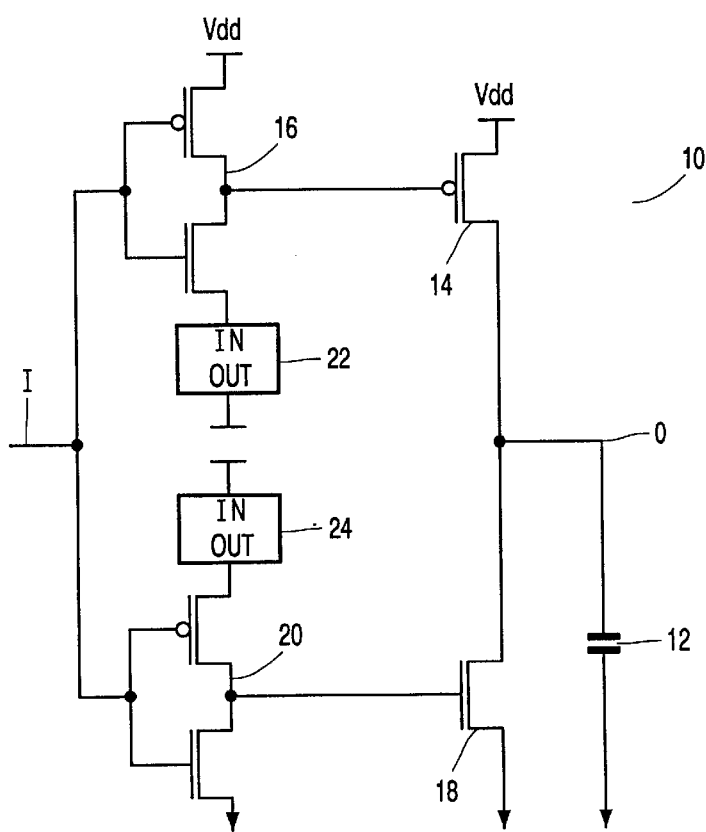
FIG. 2 shows in a diagram an embodiment of an output amplifier provided with means for decreasing its operating rate according to the present invention.

FIG. 2 shows an output amplifier 10 similar to that described in relation to FIG. 1. However, the inverter 16 controlling transistor 14 is supplied, according to the present invention, between the supply voltage terminal Vdd and a current limitation device 22. Similarly, the inverter 20 is supplied, according to the present invention, between a compensation device 24 and ground.

The rate at which the output amplifier 10 switches to 1 depends on the rate at which inverter 16 discharges the gate of transistor 14. Current limiting device 22 enables to control the current that flows through inverter 16 when the latter discharges the gate of transistor 14. When the current flowing through the device 22 decreases, the rate at which inverter 16 discharges the gate of transistor 14 will decrease, as will the rate at which the amplifier 10 switches to 1. The device 22 is devised for producing a current that decreases when the intrinsic conductivity of the P-channel MOS transistors of the circuit increases. An increase in intrinsic conductivity of the transistor 14 is compensated by a decrease and the rate at which it is controlled.

Similarly, current limiting device 24 enables to decrease the rate at which the output amplifier 10 switches to 0 by controlling the rate of control of transistor 18. The current limiting device 24 is devised for allowing a current to flow through whose value decreases when the conductivity of the N-channel MOS transistors increases.

Figure 3:
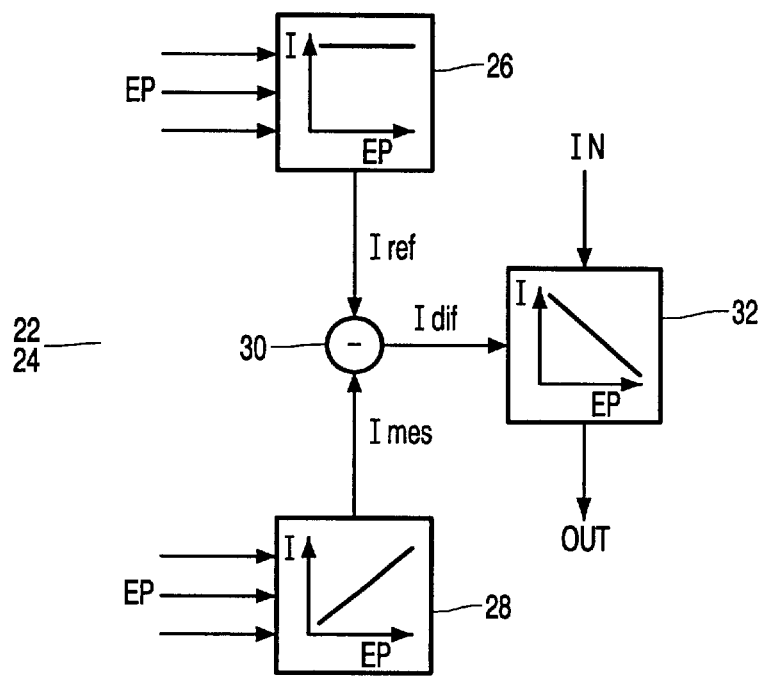
FIG. 3 shows a simplified diagram of a compensation device for decreasing the operating rate of a circuit according to the present invention.

FIG. 3 shows a simplified diagram of a compensation device 22 or 24 shown in FIG. 2. It includes a constant current source 26, a variable current source 28 and a subtracter 30 providing the difference Idif between current Iref generated by source 26 and current Imes generated by source 28. The subtracter 30 controls a device 32 that establishes an adjustable current, proportional to signal Idif.

The current source 26 produces a substantially constant current Iref independent of the environment parameters (EP) of the circuit, that is to say, of temperature, supply voltage and of the quality of the circuit transistors. Such current source may, for example, be a band-gap generator.

The variable current source 28 produces a measuring current Imes which increases when the conductivity of the MOS transistors increases due to the variation of the environment parameters of the circuit.

It should be noted that when the environment parameters increase, so that the intrinsic conductivity of the MOS transistors increases, that is to say, variable current Imes increases, current Idif will decrease, causing a decrease of the current that flows through the adjustable current device 32 and, accordingly, a slowing down of the control of the corresponding transistor 14 or 18 of the amplifier.

Figure 4:
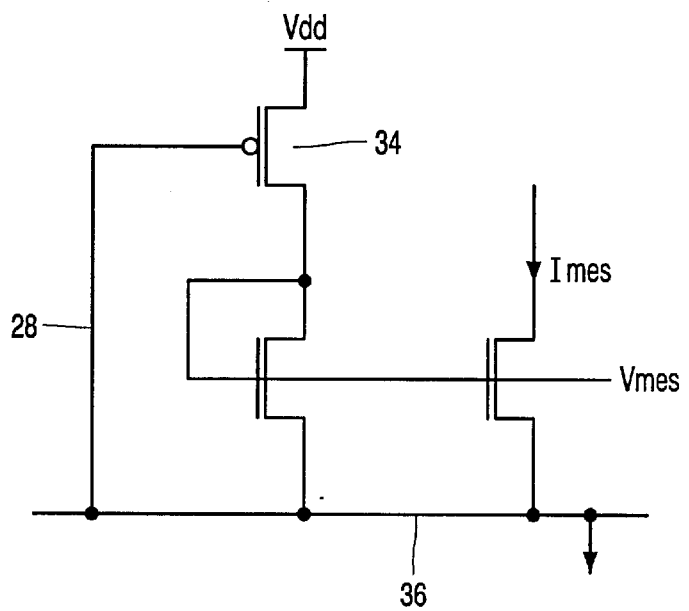
FIG. 4 shows a source producing a current that decreases with temperature, that increases with the supply voltage, and that increases with the intrinsic quality of the transistors forming it.

FIG. 4 shows an example of the variable current source 28 of FIG. 3. A P-channel MOS measuring transistor 34 is connected between supply terminal Vdd and the input of a current mirror 36. The gate of the transistor 34 is grounded. Thus, the transistor 34 behaves as a voltage source. The output of the current mirror 36 generates current Imes of the variable current source 28. The current Imes is proportional to the current flowing through the measuring transistor 34. When the conductivity of the measuring transistor 34 increases after a variation of the environment parameters, the current flowing through it will increase and measuring current Imes will correlatively increase.

It should be noted that the circuit of FIG. 4 provides a measuring current Imes adapted to compensate the intrinsic conductivity variations of a P-channel MOS transistor, and thus of the transistor 14 of the output amplifier, since current Imes depends on the conductivity of the P-channel MOS transistor 34. To compensate for the intrinsic conductivity variations of the N-channel MOS transistor 18 of the output amplifier, a circuit symmetrical to that of FIG. 4 is used, that is to say, a circuit whose transistors are of inverted conductivity types and whose supply terminals are inverted.

Figure 5:
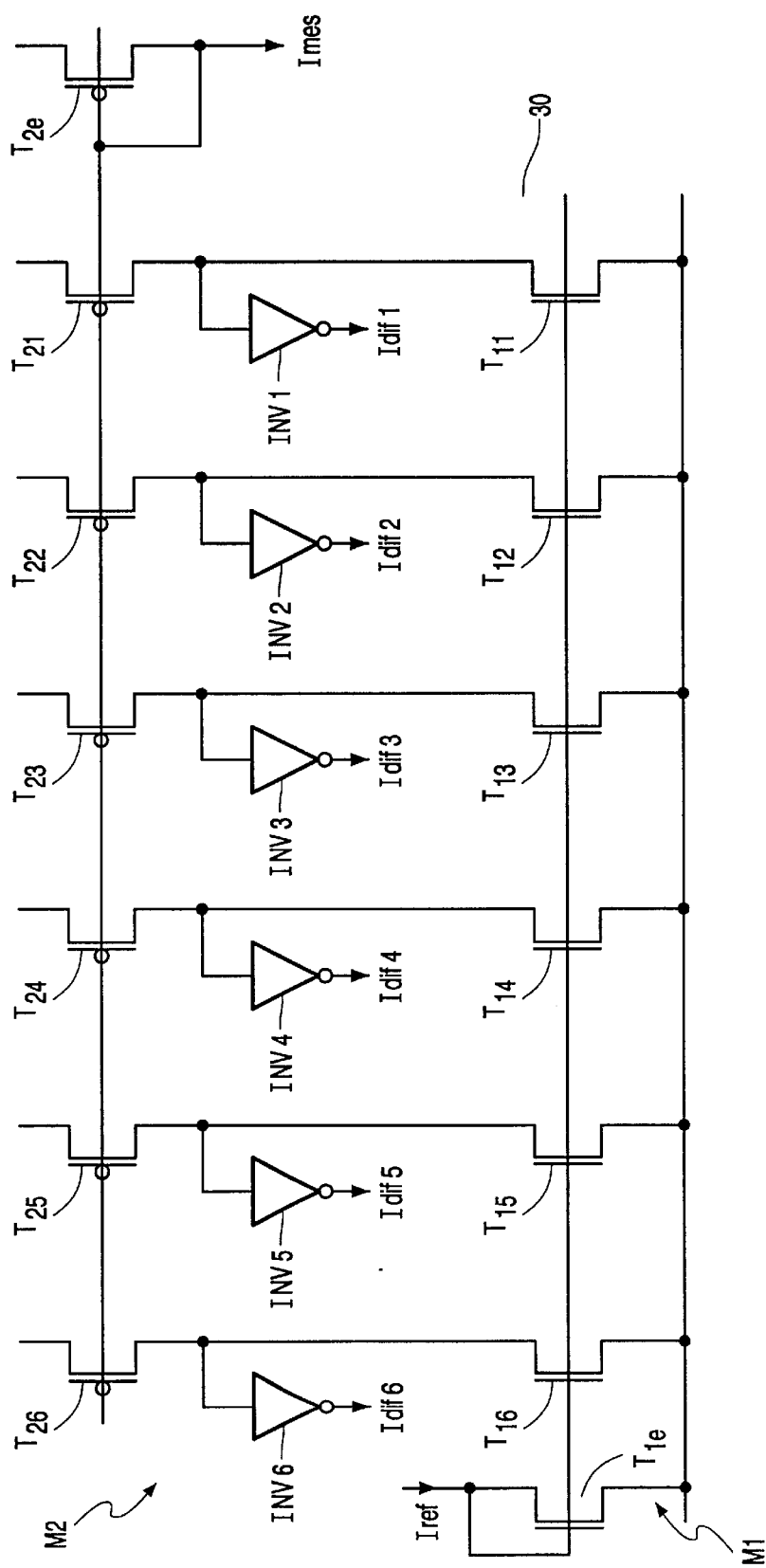
FIG. 5 shows a circuit generating a digital difference signal between a constant current and a variable current.

FIG. 5 shows a digital embodiment of the current subtracter 30 of FIG. 3. This subtracter 30 generates a digital difference signal Idif on several control lines, here, 6 lines Idif1 to Idif6. Each control line Idif is connected to the output of the respective inverter INV, the input of which is connected to the connection node between respective transistors T1 and T2. Transistors T1 are output transistors of a current mirror M1 whose input transistor T1e receives constant current Iref generated by the constant current source 26 (FIG. 3). Transistors T1 are all of the same dimensions to copy current Iref with the same ratio. Transistors T2 are output transistors of a current mirror M2 whose input transistor T2e receives variable current Imes generated by the variable current source 28 (FIG. 3). Transistors T2 are of different dimensions to copy current Imes with different ratios.

When a transistor T2 is more conductive than the transistor T1 associated therewith, the connection node of the two transistors is brought to a high potential, and the corresponding control line Idif is deactivated. Similarly, when a transistor T2 is less conductive than the transistor T1 associated therewith, a connection node of the two transistors is brought to a low potential, and the corresponding control line Idif is activated.

The dimensions of the transistors T2 are chosen so that the number of more conductive transistors T2 than the associated transistors T1 increases with the current Imes and that when the current Imes corresponds to worst case conditions, no transistor T2 conducts more than the associated transistor T1. Thus, the higher the current Imes, that is to say, the more favorable the operating conditions, the fewer signals Idif are activated.

Figure 6:
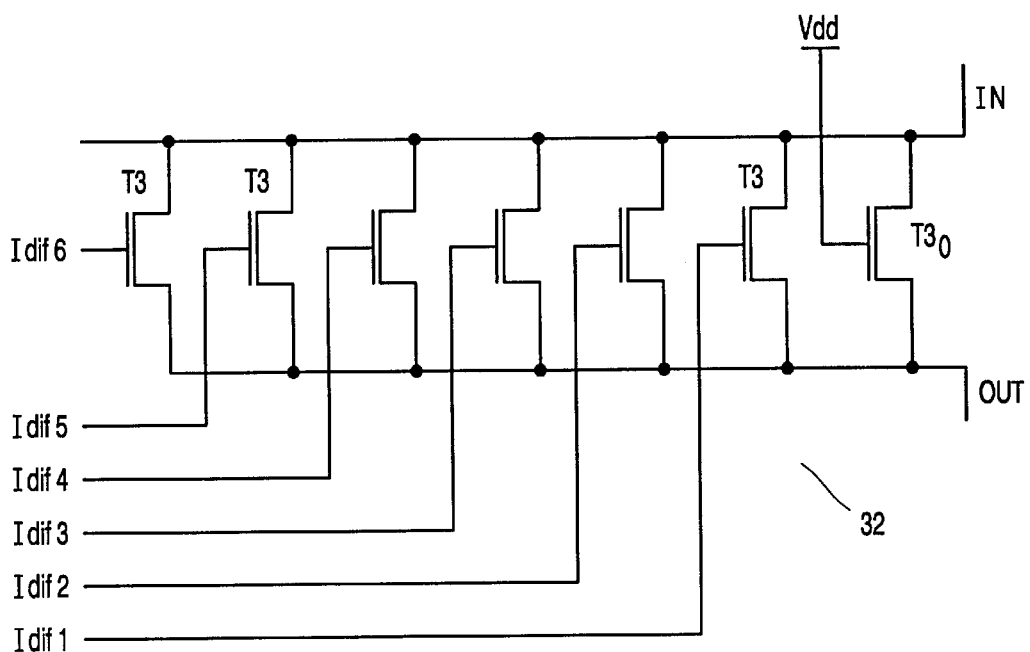
FIG. 6 shows a group of transistors providing a conductivity selected by a digital signal such as that generated by the circuit of FIG. 5.

FIG. 6 shows an example of an adjustable current device 32 which can be controlled by the digital signal Idif provided by the circuit of FIG. 5. The device 32 includes a group of N-channel MOS transistors T3 connected in parallel between an input terminal IN and an output terminal OUT. The gate of a first one $T3_0$ of these transistors is connected to the supply terminal and the gates of the other transistors are each connected to one of the control lines Idif1 to Idif6. When the measured current Imes increases, lines Idif1 to Idif 6 are deactivated one after the other and the number of conducting transistors in device 32 decreases until only the first transistor $T3_0$ conducts and the adjustable current device conducts a minimum current.

Figure 7:
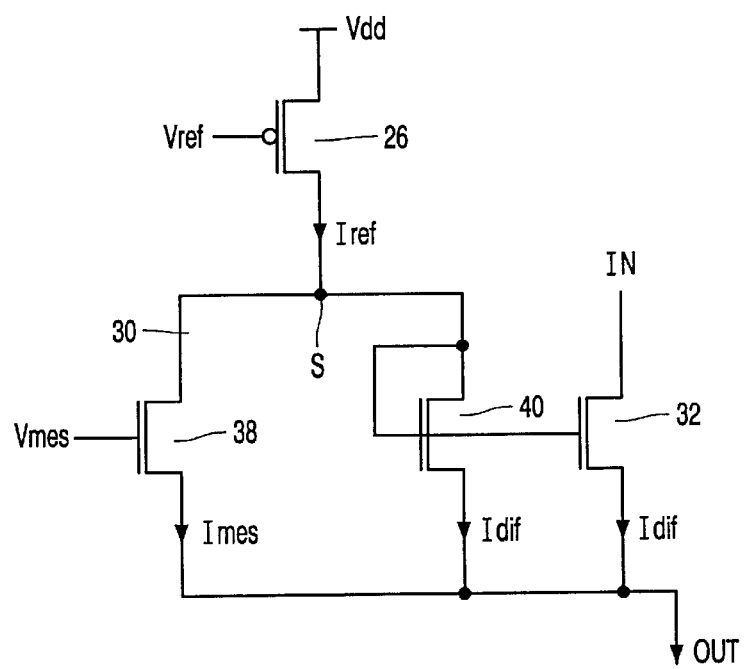
FIG. 7 shows an analog embodiment of the digital devices of FIGS. 5 and 6.

FIG. 7 shows an analog embodiment of a current subtracter 30 such as that described in relation to FIG. 3. The P-channel MOS transistor 26 connected between the supply terminal Vdd and a subtraction node S is controlled by a substantially constant reference voltage Vref as a function of environment parameters and establishes reference current Iref. An N-channel MOS transistor 38 establishing a measuring current Imes is connected between the subtraction node S and ground. The transistor 38 is, for example, the output transistor of current mirror 36 described in relation to FIG. 4. An N-channel MOS transistor 40 is diode-connected between the subtraction node S and ground. The current Idif such that Idif=Iref-Imes flows through transistor 40. The adjustable current device 32 of FIG. 3 is formed here by an N-channel MOS transistor mirror-connected with transistor 40. This transistor 32 thus establishes a current that decreases when the measured current Imes increases.

The circuits of FIGS. 6 and 7 permit to adjust the current that flows through inverter 16 to discharge the gate of the P-channel MOS transistor 14 of the amplifier. To adjust the current flowing through the inverter 20 to charge the gate of the N-channel MOS transistor 18, circuits symmetrical with respect to those of FIGS. 6 and 7 are used, that is, circuits having transistors of inverted conductivity type and inverted supply terminals.

Figure 8:
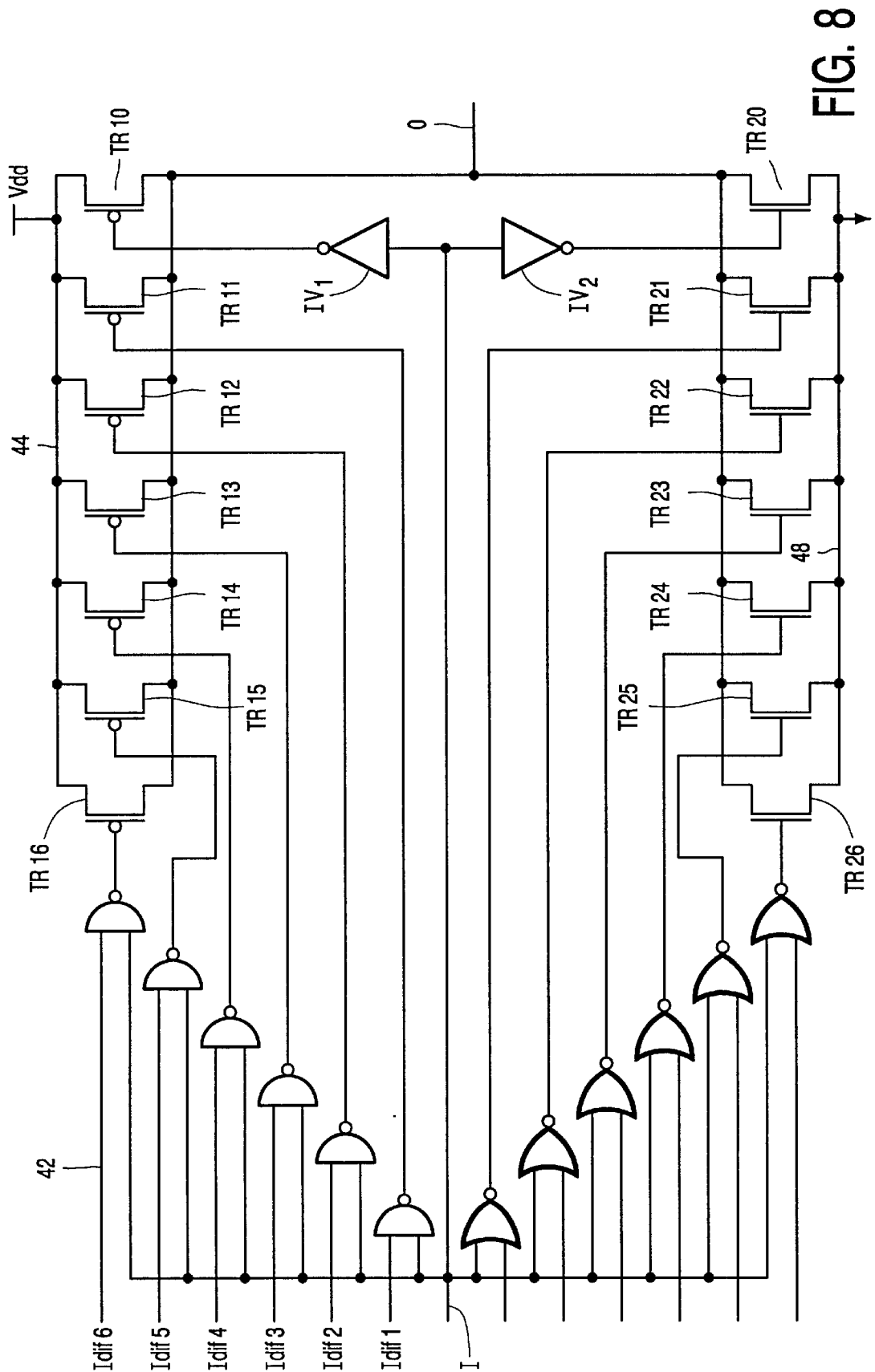
FIG. 8 shows an alternative embodiment of an output amplifier according to the present invention.

FIG. 8 shows an alternative output amplifier 42 according to the present invention. The alternative output amplifier 42 includes a group 44 of P-channel MOS switching transistors TR10 to TR16 connected in parallel between the supply terminal Vdd and the output terminal 0 and a group 48 of N-channel MOS switching transistors TR20 to TR26, connected in parallel between ground and the output terminal 0. The gate of the first transistor TR10 of the group 44 receives an input signal I via an inverter INV1. The gate of each transistor TR11 to TR16 is connected to be activated when the input signal I and an associated control signal Idif1 to Idif6 are activated. The control signals Idif are, for example, generated by a current subtracter as shown in FIG. 5. The transistors of the group 48 are controlled in similar manner by a digital difference signal varying according to the intrinsic conductivity of an N-channel MOS transistor.

When all the control signals Idif1 to Idif6 are active, all the switching transistors of the group 44 are on and the current that can flow through the alternative output amplifier 42 is maximum. Thus, the rate at which the amplifier 42 can charge a capacitor connected to its output 0 is maximum. When the control signals Idif1 to Idif6 are deactivated as the conductivity of the P-channel MOS transistors increases, the number of activated transistors of the group 44 decreases, of which the result is that the conductivity of the group 44 decreases and compensates the increase of intrinsic conductivity of the P-channel MOS transistors. If no signal Idif is active, only transistor TR10 is likely to conduct and ensures the minimum conductivity of the group 44.

The dimensions of the switching transistors of the group 44 are chosen so that the conductivity decrease of the group due to the deactivation of one of its transistors compensates the intrinsic conductivity increase of the transistors.

The operation of the group 48 is similar to that of the group 44. It enables to limit the rate at which the alternative output buffer 42 can discharge a capacitor connected to its output 0 when the environment parameters of the circuit transistors become favorable.

The present invention can also be applied to other circuits than output amplifiers.

Figure 9:
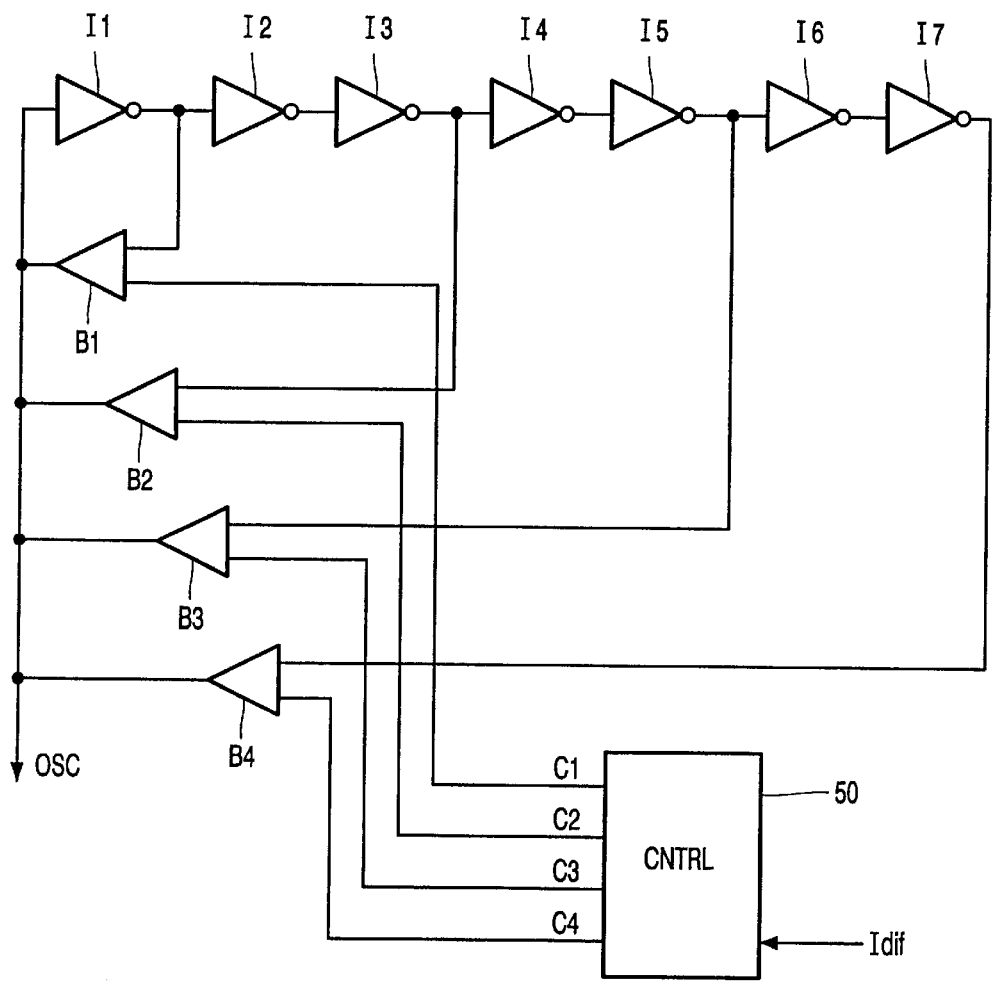
FIG. 9 shows an application of a compensation device according to the present invention to a ring oscillator.

Thus, FIG. 9 shows an application of the present invention to a ring oscillator. The oscillator includes an odd number of inverters I1 to I7 connected in series. The output of the first inverter I1 is connected to the input of the first inverter I1 via a switch B1 controlled by a control signal C1. Similarly, the outputs of the inverters I3, I5 and I7 are connected to the input of inverter I1 via respective switches B2 to B4 controlled by control signals C2 to C4.

The control signals C1 to C4 are produced by a control circuit 50 so that a single one of the signals C1 to C4 is activated at a time, depending on the value of difference Idif between the constant current Iref and the variable current Imes. The signals C1 to C4 may easily be generated on the basis of control signals such as Idif1 to Idif4 of FIG. 5. The control circuit 50 inserts, using signals C and switches B, an increasing number of inverters in the oscillator loop when the current difference Idif increases. Thus, an increase of the intrinsic conductivity of the transistors which would lead to a frequency increase of an oscillator with a fixed number of inverters, is compensated by an increase of the number of inverters in the oscillator loop of FIG. 9.

What is claimed is:

1. A circuit having an operating rate that varies as a function of temperature, supply voltage and intrinsic quality of the transistors of the circuit, characterized in that it is associated to a compensation circuit comprising:

a constant current source (26) supplying a substantially constant current that is independent of temperature, supply voltage, and intrinsic quality of the transistors of the circuit, a variable current source (28) supplying a current that increases with the inverse of temperature, supply voltage and intrinsic quality of the circuit transistors and means for decreasing the circuit operating rate when the difference of the currents supplied by the first and second sources increases.

2. A circuit as claimed in claim 1, characterized in that said means (22, 24) are provided for decreasing the rate of variation of control signals of circuit transistors when said current difference increases.

3. A circuit as claimed in claim 1, characterized in that it comprises switching MOS transistors connected in parallel (44, 48), and in that said means are provided for concurrently turning on a decreasing number of said transistors when said current difference increases.

4. A circuit as claimed in claim 1, characterized in that it comprises inverters (I1, . . . , I7) connected in a ring forming an oscillator, and in that said means (50, B1, . . . , B4) are provided for increasing the number of inverters connected in the ring when said current difference increases.

5. A circuit as claimed in claim 2, characterized in that it comprises:

a first MOS transistor (14, 18) of a first conductivity type connected between a first supply terminal and an output terminal, and an inverter (16, 20) whose output terminal is connected to the gate of the first transistor, the means for reducing the rate comprising an adjustable current source connected between a second supply voltage and a supply terminal of the inverter, a second supply terminal of the inverter being connected to the first supply voltage.

6. A circuit as claimed in claim 5, characterized in that the adjustable current source is a second MOS transistor (32) of a second conductivity type, controlled by a voltage varying in opposite direction to said current difference.

\* \* \* \* \*